United States Patent [19]

Polese et al.

[11] Patent Number: 5,413,751
[45] Date of Patent: May 9, 1995

[54] METHOD FOR MAKING HEAT-DISSIPATING ELEMENTS FOR MICRO-ELECTRONIC DEVICES

[75] Inventors: Frank J. Polese, 4421 Granger St., San Diego, Calif. 92126; Walter V. Giniel, San Marcos, Calif.; Terrence V. Hermes, San Diego, Calif.; Vladimir Ocheretyansky, Santee, Calif.

[73] Assignee: Frank J. Polese, San Diego, Calif.

[21] Appl. No.: 64,255

[22] Filed: May 20, 1993

Related U.S. Application Data

[63] Continuation-in-part of Ser. No. 46,635, Apr. 14, 1993, abandoned.

[51] Int. Cl.⁶ .................................................. B22F 3/12
[52] U.S. Cl. .......................................... 419/23; 419/30; 419/39; 419/47; 75/245; 75/248
[58] Field of Search .................. 75/245, 246, 247, 249; 419/30, 40, 39, 47, 23

[56] References Cited

U.S. PATENT DOCUMENTS

| | | | |
|---|---|---|---|
| 3,128,172 | 4/1964 | Wagner et al. | 75/5 |
| 3,685,134 | 8/1972 | Blue | 29/420.5 |
| 4,158,719 | 6/1979 | Frantz | 428/567 |
| 4,680,618 | 7/1987 | Kuroda et al. | 357/74 |
| 4,752,334 | 6/1988 | Nadkarni et al. | 75/235 |
| 4,788,627 | 11/1988 | Ehlert et al. | 361/387 |
| 5,039,335 | 8/1991 | Gondusky et al. | 75/246 |
| 5,049,184 | 9/1991 | Harner et al. | 75/246 |
| 5,086,333 | 2/1992 | Osada et al. | 357/67 |

OTHER PUBLICATIONS

Jones, W. D. "Fundamental Principles Powder Metallurgy", 1961, pp. 52-53, 232, 471-473.

*Primary Examiner*—Ngoclan T. Mai
*Attorney, Agent, or Firm*—Henri J. A. Charmasson; John D. Buchaca

[57] ABSTRACT

High density heatsinks for microcircuit packages are formed by first mold-pressing a composite powder of free-flowing spray-dried particles of copper and at least one other denser material such as tungsten and/or molybdenum, the proportions of which are adjusted to match the thermal expansion characteristics of the microcircuit material. The pressed compacts are then heated in a sintering furnace at 1,200° C. to 1,350° C. in order to effect an homogeneous distribution of the melting copper throughout the structure. The process results in a readily usable component having good thermal conductivity and matched thermal expansion that requires no further machining.

15 Claims, No Drawings

METHOD FOR MAKING HEAT-DISSIPATING ELEMENTS FOR MICRO-ELECTRONIC DEVICES

PRIOR APPLICATION

This application is a continuation-in-part of Ser. No. 08/046,635, filed Apr. 14, 1993, now abandoned.

FIELD OF THE INVENTION

The instant invention relates to powder metallurgy and to the fabrication of micro-electronic packages, and more specifically to the manufacture of other heat-dissipating elements having a coefficient of thermal expansion compatible with the material used in the fabrication of microcircuits.

BACKGROUND OF THE INVENTION

The fabrication of electronic microcircuits requires the use of substrates, heatsinks, electrodes, leads, connectors, packaging structures and other components capable of dissipating the heat generated by the active parts of the microcircuit or by the soldering, brazing or glass-sealing process. Moreover, those components that are in direct contact with the active microcircuit sections must have a coefficient of thermal expansion compatible with gallium arsenide, polysilicon, germanium or any material used in the fabrication of the microcircuit.

Materials such as copper, silver, gold and aluminum which exhibit high coefficient of heat dissipation tends also to have coefficients of expansion much higher than materials such as gallium arsenide alumina or polysilicon which are used in the implementation microcircuit elements or their enclosures.

As disclosed in U.S. Pat. No. 4,680,618 Kuroda et al., it has been found convenient to use composites of copper and other denser metals such as tungsten or molybdenum in the fabrication of heatsinks, substrates and other heat-dissipating elements of microcircuits. The proportions of the metals in the composite are designed to match the coefficient of thermal expansion of the material used in the fabrication of the active circuit component.

The coefficient of thermal expansion of a metal is defined as the ratio of the change in length per degree Celsius to the length at 0° C. It is usually given as an average value over a range of temperatures. Metal used in electrical conductors such as aluminum, copper, silver and gold that have a low electrical resistivity also exhibit high coefficients of thermal conductivity. The coefficient K of thermal conductivity of a material is defined as the time rate of heat transfer through unit thickness, across unit area, for a unit difference in temperature or $K = WL/A\Delta T$ where $W$=watts, $L$=thickness in meters, $A$=area in square meters, and $T$=temperature difference in °K. or °C. For copper, K is equal to 388. For silver, K is equal to 419. However, these metals exhibit an average coefficient of thermal expansion in excess of $15 \times 10^{-6}/°C$. By contrast, material such as gallium arsenide and silicon, that are commonly used in the manufacture of microcircuit chips have an average coefficient of thermal expansion of less than $7 \times 10^{-6}/°C$. Thus, while material of high electrical and thermal conductivity are favored in the fabrication of heat-dissipating electric elements, they must be blended with conductive material exhibiting a much lower average coefficient of expansion in order to create a composite whose thermal expansion characteristic comes as close as practically possible to that of gallium arsenide, silicon and other micro-chip materials. Tungsten and molybdenum with average coefficient of thermal expansion of $4.6 \times 10^{-6}/°C$. and $6 \times 10^{-6}/°C$. and coefficient of thermal conductivity of 160 and 146 respectively are favored.

However, while copper, aluminum, and silver have specific gravities of less than 9, and melting point of less than 1,100 °C., tungsten and molybdenum have specific gravities of 19.3 and 10.2, and melting points of 3,370° C. and 2,630° C. respectively.

Due to the large differences in the specific gravities and melting-points, and lack of mutual solubility of metals such as copper and tungsten, for example, it is difficult to form composites of those two metals that exhibit a reliable degree of homogeneity using conventional melting processes.

As disclosed in U.S. Pat. No. 5,086,333, it has been found more practical to press and sinter a powder of the most dense materials, e.g., tungsten, to form a porous compact, then to infiltrate the compact with molten copper or another lighter material. A slab of the resulting material can then be cut and machined to form heatsinks, connectors, substrates and other heat-dissipating elements.

The instant invention results from an attempt to devise a simpler and more practical process to manufacture such heat-dissipating components using powder metallurgy techniques.

SUMMARY OF THE INVENTION

The principal and secondary objects of the invention are to provide a practical and simple process to form heatsinks and other heat-dissipating elements of microcircuit devices from a composite combining a metal having a high coefficient of heat dissipation and thermal expansion with a denser metal of lower thermal expansion characteristics, where the composite is homogeneous, maintains a low-porosity (less than 4%), and can be formulated to exhibit a desired coefficient of thermal expansion while at the same time reducing or eliminating some of the machining and other finalizing steps.

These and other objects are achieved by press-forming the desired component from composite powders of the metal components, then sintering the pressed compacts to achieve a homogeneous distribution of the low-density and low-melting point metal such as copper throughout the structure.

DESCRIPTION OF THE PREFERRED EMBODIMENT OF THE INVENTION

The preferred embodiment of the claimed process will be described in connection with the fabrication of heatsinks used in microelectronic devices. The same process may be used in making other articles of manufacture requiring a combination of metals of substantially different specific gravities and/or melting temperatures.

A mixture of particles of at least one metal or alloy having an average coefficient of thermal conductivity of approximately 200, and at least one second metal or alloy having an average coefficient of thermal expansion of less than $7 \times 10^{-6}/°C$. is press-molded at room temperature into compacts in the shape of the desired heatsinks using a pressure from 1,350 to 3,400 atmospheres (20,000 to 50,000 lbs. per square inch).

The first metal or alloy is preferably selected from a group consisting of aluminum, copper, gold and silver. The second metal or alloy is preferably selected from a group consisting of tungsten and molybdenum.

The metal particles may have been formed by techniques well-known to those skilled in powder metallurgy, such as by chemical reduction or atomization. Non-spherical particles obtained by a reduction or atomizing process such as the one disclosed in U.S. Pat. No. 3,128,172 in connection with copper powders are preferred in order to obtain a higher degree of friction between the particles and to increase the surface area of each particle so as to prevent segregation of the materials according to their respective densities. It has been found that the homogeneity of the final composite may be improved by using a free-flowing powder mixture of pre-clustered particles of the different density metals. Free-flowing powder refers to those powders which flow unaided through a Hall flow-meter funnel having an orifice of 2.54 millimeters (0.1 inch) as specified under standards published by the Metal Powder Industries Federation (MPIF). Such pre-clustering may be accomplished by adding a volatile liquid adhesive to the mixed powder particles to form a slurry. The slurry is then atomized into droplets through a process whereby the slurry is subjected to blasts of a gas, typically air, heated to a temperature above the melting point of the volatile liquid adhesive. After drying, the droplets combining all types of particles, are continuously collected and poured into the press mold to form the "green" compact in the shape of the desired article. Pre-clustered mixtures may be obtained through other methods resulting in a temporary bond between particles of different densities. The bond must be relatively weak so as to be broken under the pressure applied to the press-mold in order to form a more homogeneous compact.

The compacts are then placed in a furnace and sintered at a temperature sufficient to melt the material having the lowest melting point and the lowest specific gravity. As the particles of the latter, typically copper, melt, the fluid metal phase forms a film surrounding the solid phase, typically the tungsten or molybdenum particles, providing a good wetting condition. The lack of metal solubility of the proposed composite favorizes the formation of the liquid film and enhances the surface tension that acts as the principal mechanism yielding a higher densification and pore elimination. The sintering of the described compacts do not show any slumping even with a shrinkage of about 15% that characterizes the above-described fabrication of final composite blocks having the shape of the desired heatsinks without need of any further cutting, stamping or machining.

EXAMPLE

A copper and tungsten powder was selected that contained approximately 15 percent copper and 85 percent tungsten by weight (27.7 percent and 72.3 percent per volume). The powder mixture consisted of particles of metal averaging 1 to 2 microns in diameter. The mixture had been spray-dried and treated to form homogeneous and lightly-bound agglomerates of tungsten and copper particles in nodules of approximately 100 to 200 microns in diameter. Such a powder mixture is manufactured by Sylvania of Towanda, Pa. according to the inventors' specifications disclosed herein.

The mixture was press-molded at room temperature under 3,000 atmospheres (44,000 lbs/in²) into the final 1.9 cms×1.9 cms×0.20 cms shapes of the desired heatsinks for microelectronic assemblies. The resulting "green" compacts were placed in a sintering furnace and subjected to a temperature of 1,200° C. to 1,350° C. for one hundred eighty minutes.

After cooling, the final articles exhibited a specific gravity of 16.15, as compared to the 16.41 gravity that would result from a perfectly solid composite.

Observation under 1,000×magnification of the products manufactured according to this example, and similar products manufactured by press-molding of the tungsten powder alone and subsequent infiltration by melted copper shows that the invention resulted in substantially finer distribution of the copper, improved homogeneity of the final material.

Other compositions with tungsten to copper ratios of 80/20 through 90/10 were similarly fabricated that exhibited coefficients of thermal expansion ranging from 6.5 to $10 \times 10^{-6}$/°C. sufficient to match the thermal expansion coefficient of gallium arsenide, $Al_2O_3$ and other materials used in the fabrication of microelectronic packages, while retaining coefficient of thermal conductivity between 140 and 200 W/m°K.

While the preferred embodiment of the invention has been described, modifications can be made and other embodiments may be devised without departing from the spirit of the invention and the scope of the appended claims.

What is claimed is:

1. A process, for forming an homogeneous material combining a first metal and at least one second metal having a higher specific gravity and a higher melting point than the first metal, which comprises:
   selecting a free-flowing mixture of powdered particles of the first and second metals;
   said mixture comprising nodules grouping particles of the first and second metals breakably bonded together;
   pressing said mixture within a mold into a compact under pressure sufficient to break apart said bonded particles; and
   sintering said compact to a temperature sufficient to melt particles of the first metal.

2. The process of claim 1, wherein said pressing comprises compacting said mixture into a mold at room temperature.

3. The process of claim 2, wherein said pressing further comprises using a mold defining an article of manufacture.

4. The process of claim 3, wherein said pressing comprises compacting said mixture under a pressure ranging from 1,350 atmospheres to 3,400 atmospheres (20,000 lbs/in² and 50,000 lbs/in²).

5. The process of claim 3, wherein said pressing further comprises mold-pressing said mixture into the shape of a heat-dissipating component for an electronic assembly.

6. The process of claim 5, wherein said selecting comprises selecting said first metal from a group consisting of metals and alloys having a coefficient of thermal conductivity of at least 200 w/m°K. and a melting point of less than 1,500° C.

7. The process of claim 5, wherein said first metal is selected from a group consisting of aluminum, copper, gold and silver.

8. The process of claim 6, wherein said selecting comprises selecting said second metal from a group consisting of metals and alloys having an average coefficient of thermal expansion of less than $10^{-5}$/°C.

9. The process of claim 8, wherein said second metal is selected from a group consisting of tungsten and molybdenum.

10. The process of claim 8, wherein said selecting comprises selecting a mixture having a ratio of first to second metals calculated to yield a specific range of average coefficient of thermal expansion for said article of manufacture falling between $4 \times 10^{-6}/°C$ and $11 \times 10^{-6}/°C$.

11. The process of claim 10, wherein:
said selecting comprises selecting copper as said first metal and tungsten as said second metals; and
said sintering comprises sintering under a temperature between 1,200° degrees to 1,350° C.

12. The process of claim 1, wherein said selecting comprises selecting a dry mixture of said particles.

13. The process of claim 12, wherein said step of selecting comprises selecting an aggregate powder consisting of particles of the first and second metals, breakably bonded together into nodules.

14. The process of claim 13, wherein said step of selecting comprises selecting said aggregate wherein each of said particles has a diameter of no more than 2 microns.

15. The process of claim 13, wherein said step of selecting comprises selecting said aggregate including free-flowing nodules having an average diameter of no more than 200 microns.

* * * * *